(12) United States Patent
Ziglioli

(10) Patent No.: US 9,761,511 B2
(45) Date of Patent: Sep. 12, 2017

(54) ELECTRONIC COMPONENTS WITH INTEGRAL LEAD FRAME AND WIRES

(71) Applicant: STMICROELECTRONICS S.R.L., Agrate Brianza (IT)

(72) Inventor: Federico Giovanni Ziglioli, Pozzo D'Adda (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 14/980,546

(22) Filed: Dec. 28, 2015

(65) Prior Publication Data

US 2016/0315034 A1    Oct. 27, 2016

(30) Foreign Application Priority Data

Apr. 24, 2015   (IT) .............. TO2015A0230

(51) Int. Cl.
| H01L 23/495 | (2006.01) |
| H01L 21/48 | (2006.01) |
| H01L 21/56 | (2006.01) |
| H01L 23/00 | (2006.01) |

(52) U.S. Cl.
CPC .... *H01L 23/49541* (2013.01); *H01L 21/4825* (2013.01); *H01L 21/4842* (2013.01); *H01L 21/568* (2013.01); *H01L 23/4952* (2013.01); *H01L 23/49548* (2013.01); *H01L 24/48* (2013.01); *H01L 24/85* (2013.01); *H01L 24/45* (2013.01); *H01L 2224/45144* (2013.01); *H01L 2924/00014* (2013.01); *H01L 2924/181* (2013.01)

(58) Field of Classification Search
CPC ...................... H01L 23/49541; H01L 23/4952
See application file for complete search history.

(56) References Cited

U.S. PATENT DOCUMENTS

| 3,698,073 | A | * | 10/1972 | Helda | ............... H01L 23/49524 |
| | | | | | 174/537 |
| 3,750,277 | A | * | 8/1973 | Happ | .................. H01L 21/4821 |
| | | | | | 29/827 |
| 6,468,835 | B1 | | 10/2002 | Blanc et al. | |
| 2014/0268607 | A1 | | 9/2014 | Wicker et al. | |
| 2015/0249043 | A1 | | 9/2015 | Elian et al. | |

FOREIGN PATENT DOCUMENTS

| DE | 102015102884 | 9/2015 |
| WO | WO0109828 | 2/2001 |
| WO | WO2014209994 | 12/2014 |

OTHER PUBLICATIONS

Gobner et al., Micro Laser Sintering by 3D MicroPrint GmbH—Industrial Production of Micro Metal Parts, Sep. 2014, pp. 18, 3D MicroPrint, Germany.

* cited by examiner

*Primary Examiner* — Thanh V Pham

(74) *Attorney, Agent, or Firm* — Slater Matsil, LLP

(57) ABSTRACT

An electronic component includes one or more circuits having electrical connections coupled therewith. The electrical connections include a lead frame as well as electrical wires coupling the circuit or circuits to respective portions of the lead frame. The electrical wires may be formed as one piece with the respective portion of the lead frame without joints therebetween, e.g., by 3D printing.

25 Claims, 3 Drawing Sheets

ELECTRONIC COMPONENTS WITH INTEGRAL LEAD FRAME AND WIRES

TECHNICAL FIELD

The description relates to electronic components, and, more particularly, to producing electronic components such as e.g., integrated circuits (ICs).

BACKGROUND

A constant trend in manufacturing electronic components such as integrated circuits is reducing packaging cost, while also reducing packaging assembly steps and packaging wiring.

Custom packaging flexibility as well as a robust and compact structure are other factors that are considered.

SUMMARY

One or more embodiments provide improvements in manufacturing electronic components along the lines discussed in the foregoing.

One or more embodiments may refer to a corresponding component (e.g., a microelectronic component such as an integrated circuit).

Also, one or more embodiments may refer to a computer program product loadable into the memory of at least one computer configured to drive a 3D printing apparatus ad including software code portions for executing the 3D printing steps of the method of one or more embodiments when the product is run on at least one computer. As used herein, reference to such a computer program product is understood as being equivalent to reference to a computer-readable medium containing instructions for controlling a 3D printing apparatus in order to coordinate implementation of the method according to the one or more embodiments. Reference to "at least one computer" is intended to highlight the possibility for one or more embodiments to be implemented in modular and/or distributed form.

One or more embodiments may reduce metal junctions and provide robust wiring created by variable sections.

One or more embodiments may rely on the recognition that 3D printing (additive manufacturing or AM) is becoming a common technology, with dimensions, resolution, pitch available becoming increasingly accurate and with small sizes.

BRIEF DESCRIPTION OF THE DRAWINGS

One or more embodiments will now be described, purely by way of non-limiting example, with reference to the annexed figures, wherein.

It will be appreciated that, in order to facilitate understanding the embodiments, the various figures may not be drawn to the same scale.

DETAILED DESCRIPTION

In the ensuing description one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the scope of protection or the scope of the embodiments.

Figure 1:
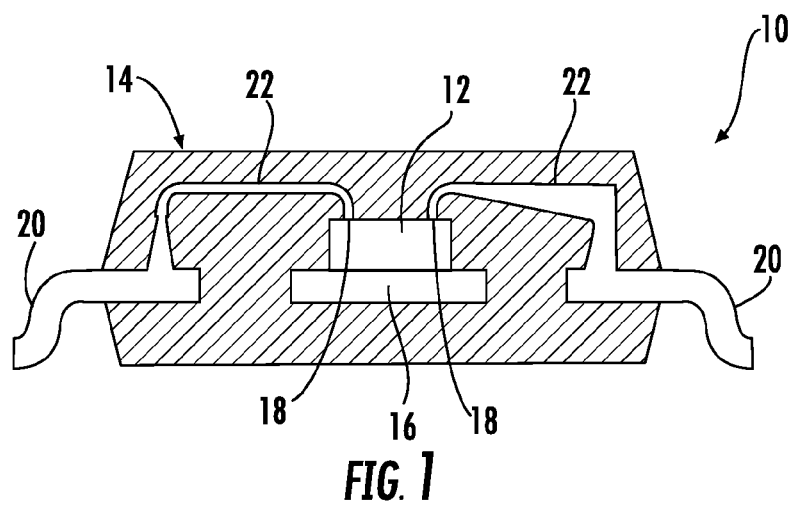
FIG. 1 is a schematic representation of an electronic circuit according to one or more embodiments.
Figure 2:
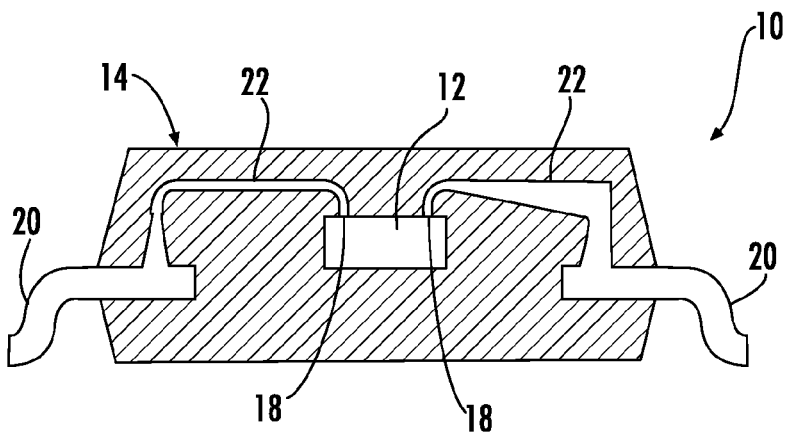
FIG. 2 is a schematic representation of an electronic circuit without a die pad according to one or more embodiments.
Figure 3:
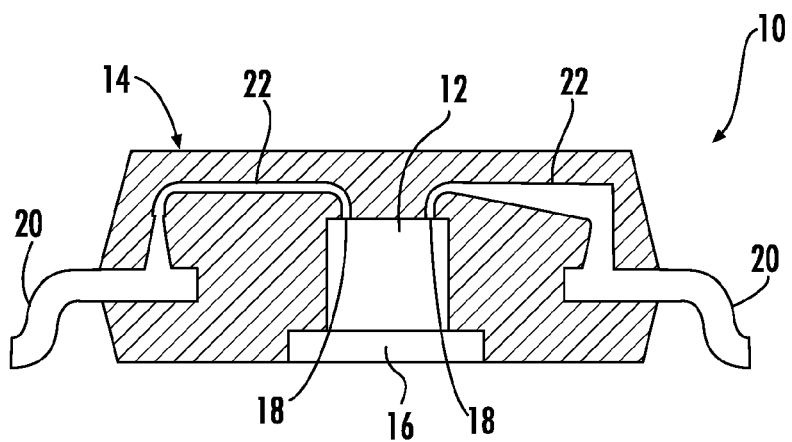
FIG. 3 is a schematic representation of an electronic circuit of a die located at a surface of a package according to one or more embodiments.

FIGS. 1 to 3 are exemplary representations of possible embodiments of electronic components 10 which may include an electronic circuit 12 such as e.g., a chip (or "die") 12 arranged in a package 14.

In one or more embodiments, the die 12 may be arranged on a die pad 16, which may be arranged within the package 14 (see e.g., FIG. 1) or located at the (e.g., bottom) surface of the package 14 (see e.g., FIG. 3).

In one or more embodiments (see e.g., FIG. 2) a die pad 16 may not be provided.

In one or more embodiments, the package 14 may include e.g., a plastics or ceramic packaging (e.g., a molding compound or MC).

Also, while one chip/die 12 is shown by way of example in the figures, plural chips/dice 12 may be included in the component 10.

Conventional manufacturing processes may involve e.g., mounting the die 14 on the pad 16, connecting die pads 18 to pins 20 of the package, and sealing the die 12 within the package 14, with electrically conductive wires 22 (e.g., gold) connecting the pads 18 to the pins 20.

The wires 22 were once attached by hand. In present-day technology that task is performed by machines, leading to a lead frame (LF), that is a set of metal leads that extend outside the package/housing 14 to form the pins 20.

In that way the package 14 may be formed (e.g., molded) encasing the one or more circuits 10 by leaving the electrical connections at least partly exposed (e.g., at the distal end of the lead frame 20) to permit electrical contact to the circuit(s) 12.

In one or more embodiments, the package 14 may include a shielding cap fused to the lead frame.

Whatever the specific details of implementation, the figures are exemplary of electronic components 10 including one or more circuits 12 having electrical connections coupled therewith.

In one or more embodiments, the electrical connections include a lead frame 20 as well as electrical wires 22 coupling the circuit or circuits 12 to respective portions of the lead frame 20.

Figure 5:
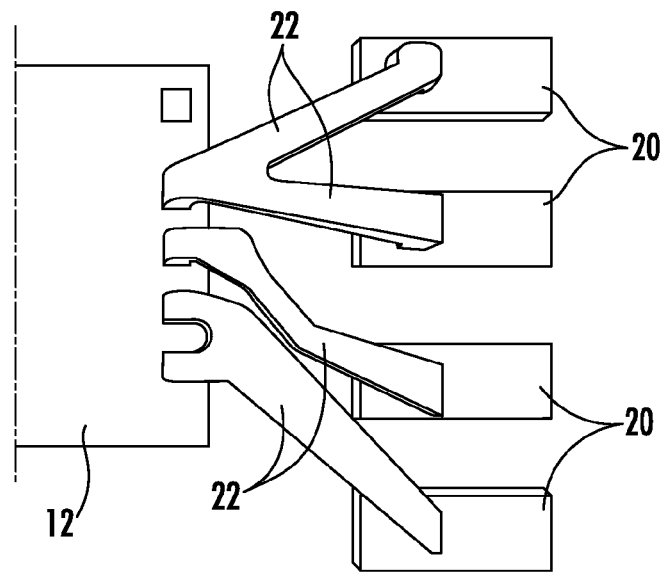
FIG. 5 is a schematic representation of electrical wires of a lead frame according to one or more embodiments.
Figure 6:
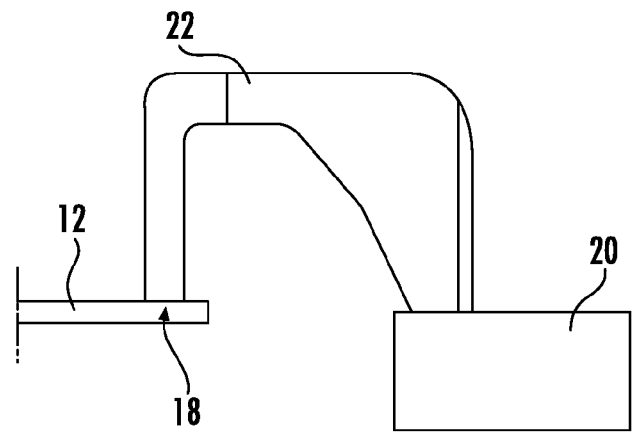
FIG. 6 is an elevational view of the electrical wires shown in FIG. 5.
Figure 7:
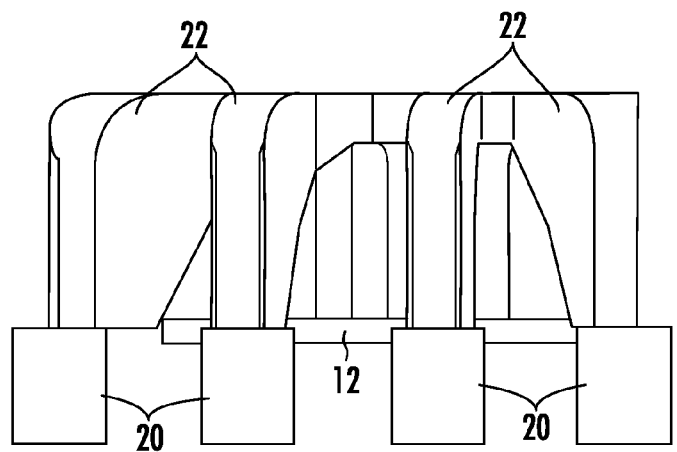
FIG. 7 is a front elevational view of the electrical wires shown in FIG. 5.
Figure 8:
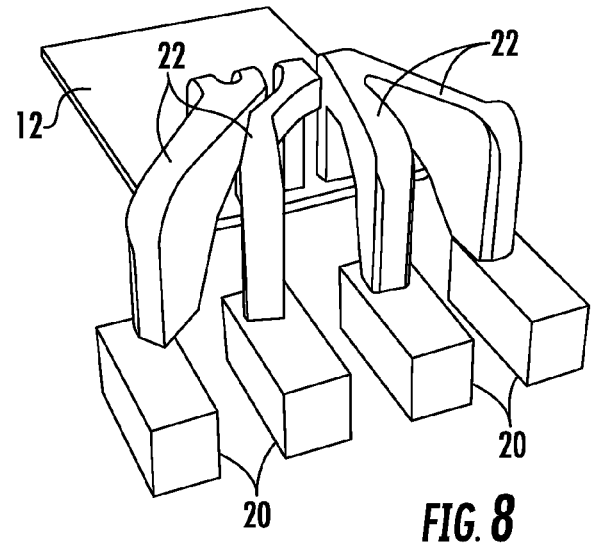
FIG. 8 is a perspective view of the electrical wires shown in FIG. 5.

This may be appreciated e.g., in FIG. 5 (and consistently in FIGS. 6 to 8) where a lead frame is shown including four portions.

In FIG. 5, two wires 22 are shown coupling the circuit 12 to the two upper portions of the lead frame 20, another wire 22 is shown coupling the circuit 12 to the third portion of the lead frame 20, and still another wire 22 is shown coupling the circuit 12 to the lowermost portion of the lead frame 20 in FIG. 5.

It will be similarly appreciated that the two upper wires 22 may be integrated to form a Y-shaped (tree-like) structure having a proximal "root" portion contacting a (single) contact pad of the circuit 12 and two distal branches extending to the two upper portions of the lead frame 20. The "intermediate" wire 22 may contact proximally a respective contact pad of the circuit 12 and extend distally to the third portion of the lead frame 20 with a linear trajectory which may be either straight or (as shown) at least slightly bent to facilitate negotiating surrounding geometries. The lowermost wire 22 in FIG. 5 may exhibit a Y-shaped (tree-like) structure having two proximal branches contacting respective contact pads of the circuit 12 and a single distal member extending to lowermost portion of the lead frame 20.

As used in connection with FIG. 5, "proximal" and "distal" are evidently referred to the circuit 12.

In one or more embodiments, any the features exemplified in FIG. 5 may be present in different combinations (e.g., with more than two wires incorporated to one another, branching being both at the circuit 12 to contact plural pads and at the lead frame to contact plural portions of the lead frame, wires being straight instead of bent and vice-versa, and so on).

FIG. 5 is thus generally exemplary of the flexibility in having electrical wires 22 couple the circuit or circuits 12 to respective portions of the lead frame 20.

In one or more embodiments, the electrical wires 22 may be produced as one piece (that is integral or "monolithic") with the respective portion of the lead frame 20 without joints (e.g., solder joints) therebetween.

In one or more embodiments, the electrical wires 22 are produced with the respective portion of the lead frame 20 as a single piece with variable cross-section.

In one or more embodiments (see e.g., FIG. 4), such a variable cross-section may include, e.g., primarily in the "wire" 22, a variable cross-section with a smooth transition e.g., from a larger core sections to a narrower cross section. More abrupt transitions may occur e.g., at the zone between the wire 22 and the respective portion of the lead frame 20.

The designation 3D printing (or additive manufacturing, AM) covers various processes which may be used to produce three-dimensional objects by means of an additive process. In such a process, layers of material may be subsequently laid by means of a "3D printer" which may be regarded as a sort of industrial robot. A 3D printing process may be computer controlled so that an object with a certain shape/geometry may be produced starting e.g., from a data source, that is by way of a computer program product for driving 3D printing apparatus and including software code portions for executing the steps of a 3D printing method when the product is run on such a computer.

The term 3D printing was originally used to designate those processes involving sequential deposition of material e.g., onto a powder bed by way of a printer head essentially resembling an ink-jet printer. The term 3D printing is now currently used to designate a variety of processes including e.g., extrusion or sintering processes. While the term additive manufacturing (AM) may in fact be more properly used in this broader sense, the two designations, 3D printing and additive manufacturing (AM) will be used herein as essentially synonymous.

As used herein, wording such as e.g., "3D printing" and "3D-printed" will therefore designate an additive manufacturing process and an item produced by additive manufacturing.

One or more embodiments may rely on the recognition that, while regarded as an intrinsically "slow" process, recent developments of 3D printing/AM may exhibit, in connection with materials such as copper, aluminium, steel, various metal alloys, parameters such as, e.g., layer thickness of 5-10 micrometers (1 micrometer=$10^{-6}$ meter), laser beam diameter of 70 micron diameter at powder surface, accuracy of 0.2%, deposition speed of 7 $mm^3$/s, which are compatible with producing electrical connections (e.g., lead frame 20, wires 22) in manufacturing processes of electronic components such as ICs.

One or more embodiments may thus produce a lead frame 20 plus the wires 22 e.g., the die attach and the wiring around the chip/die 12, with the features considered in the foregoing, that is with electrical wires 22 coupling the circuit 12 to respective portions of the lead frame 20 by producing the electrical wires 22 as one piece with the respective portion of the lead frame 20 without joints therebetween, optionally with a (gradually/abruptly) variable cross-section.

This may be by way of a "one-shot" process, which avoids the formation of joints e.g., between the lead frame 30 and the wires 22.

The materials used in 3D printing may be those already in use for that purpose, e.g., copper, aluminium, steel, various metal alloys.

One or more embodiments may not be exposed to any limitations in terms of wire format and shape, which may be e.g., square or rectangular filling the wall pad structure.

One or more embodiments may also make it possible to produce connections (e.g., at lead interface) with a variable cross-section, possibly without any metal joints.

In one or more embodiments, this may be beneficial in that a variable cross-section makes it possible e.g., to strengthen a connection/coupling in order to increase reliability e.g., with respect to possible delamination or breaks during thermal cycles or the like.

It will be appreciated that one or more embodiments make it possible to short-circuit plural leads with e.g., double (twin) wires and/or to create non-conventional connection geometries (see e.g., FIGS. 5 to 8).

A package 14 encasing the circuit(s) 12 and leaving the electrical connections 20, 22 at least partly exposed to permit electrical contact to the circuit 12 may then be formed by molding the package 14 (as appreciated by those of ordinary skill in the art) onto the circuit(s) 12.

In one or more embodiments, the circuit (e.g., a chip/die) 12 may be positioned by attaching it on a carrier.

Figure 4:
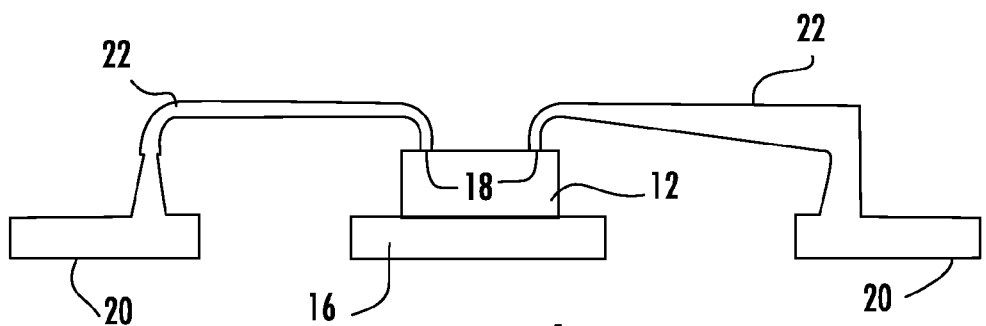
FIG. 4 is a schematic representation of electrical wires having a variable cross section of one or more embodiments.

As schematically shown in FIG. 4, in those embodiments providing for the presence of such a die pad 16 (see e.g., FIGS. 1 and 3), the carrier may be such a pad 16 e.g., a metal carrier (e.g., slug/die pad) e.g., for a die matrix.

In those embodiments where a die pad 16 is not contemplated (see e.g., FIG. 2) the carrier may be a carrier tape and the carrier tape onto which the circuit 12 is attached may be provided with holes for pad wire bonding.

The assembly (e.g., strip) formed by attaching the chip/die 12 on a carrier may then be inserted into metal powder for 3D printing in order to create (by 3D printing) the lead frame structure and wires 20, 22 and possibly complete wire bonding (WB) connections 18, e.g., on a die pad.

Figure 9:
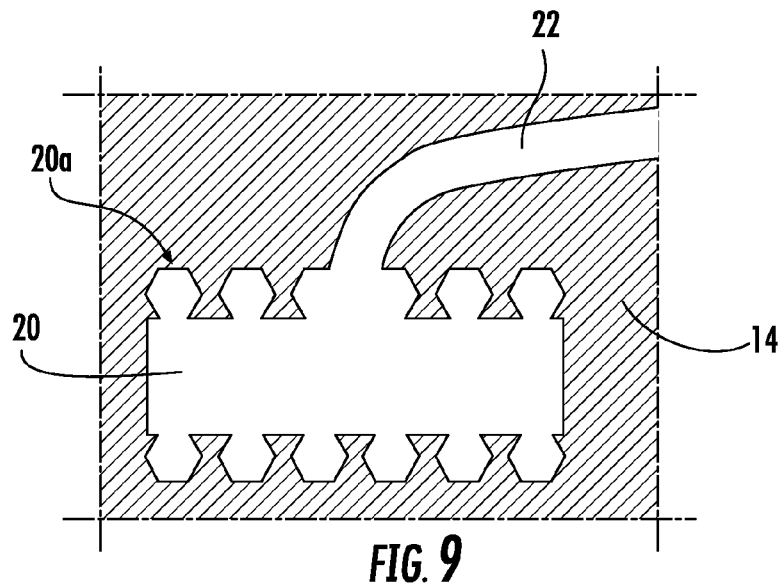
FIG. 9 is a representation of 3D printed surfaces with patterned configurations.

FIG. 9 shows that the e.g., 3D printed surfaces may be provided with patterned configurations 20a such as e.g., a honeycomb pattern, and so on, e.g., in order to improve adhesion to the molding compound of the package 14.

After the 3D printing process (e.g., once removed from the 3D printing powder) the resulting arrangement of e.g., the circuit 12, possibly with a pad 16, the lead frame and wires 20, 22 may be passed on to a molding process (of any know type) for the package 14, possibly after being blown, cleaned and/or plasma treated.

One or more embodiments having been adopted in producing an electronic component may be detected e.g., via surface analysis of exposed leads and/or X-Ray analysis of 3D configuration of internal leads.

Without prejudice to the underlying principles, the details and embodiments may vary, even significantly, with respect to what is illustrated herein purely by way of non-limiting example, without thereby departing from the extent of protection.

The extent of protection is determined by the claims that follow.

The invention claimed is:

1. An electronic component comprising:
at least one circuit disposed within a substrate; and
electrical connections coupled to the at least one circuit, the electrical connections comprising
a lead frame comprising a lead oriented in a first direction,
electrical wires coupling the at least one circuit to respective portions of the lead frame being formed as one piece without joints therebetween, wherein the electrical wires comprises a first section oriented in a second direction, a second section oriented in the first direction, and a third section oriented in the second direction, wherein the first section is perpendicular to the lead and the second section, and parallel to the third section, wherein the second section is offset from the lead in the second direction, wherein the third section has a first end joining the second section and an opposite second end having a exposed end surface, wherein a normal to the exposed end surface is oriented along the second direction, wherein the third section is joined to the at least one circuit through the exposed end surface, and wherein the exposed end surface faces the substrate.

2. The electronic component of claim 1, wherein the electronic component comprises an integrated circuit.

3. The electronic component of claim 1, wherein the electrical wires formed as one piece with the respective portion of the lead frame have a variable cross-section.

4. The electronic component of claim 1, further comprising a package encasing the at least one circuit, wherein the electrical connections of the at least one circuit being at least partly exposed from the package to permit electrical contact to the at least one circuit.

5. The electronic component of claim 4, wherein the package comprises a molded package.

6. The electronic component of claim 4, further comprising:
a carrier for the at least one circuit; and
the package formed onto the at least one circuit with the electrical connections.

7. The electronic component of claim 6, wherein the carrier comprises one of a carrier pad for the at least one circuit, and a carrier tape provided with holes configured for pad wire bonding.

8. A semiconductor package comprising:
a semiconductor die comprising a contact pad;
an encapsulant material disposed around the semiconductor die; and
a lead extending outwards from the semiconductor package, the lead comprising
a first section, disposed in the encapsulant material, extending in a first direction towards the semiconductor die;
a second section, disposed in the encapsulant material, extending away from the first section in a second direction,
a third section, disposed in the encapsulant material, extending away from the second section in the first direction, and
a fourth section, disposed in the encapsulant material, extending away from the third section, wherein the first section, the second section, the third section, and the fourth section are a single integral piece without joints, wherein the third section overlaps with the first section along the second direction, wherein the fourth section is coupled to the contact pad on the semiconductor die.

9. The package of claim 8, wherein the second section, the third section, and the fourth section form a U-shaped electrical connection.

10. The package of claim 8, wherein the first section comprises a honeycomb pattern.

11. The package of claim 8, wherein the second section or the third section has a first sidewall parallel to the second direction, and an opposite second sidewall inclined to the first sidewall.

12. The package of claim 8, wherein the second section has a varying cross-section, wherein the cross-section of the second section at a first point proximate to the third section is smaller than the cross-section of the second section at a second point proximate to the first section.

13. The package of claim 8, wherein the third section comprises a constantly varying cross-sectional area.

14. The package of claim 8, wherein the fourth section has a first end joining the third section and an opposite second end having a exposed end surface, wherein a normal to the exposed end surface is oriented along the second direction, wherein the fourth section is joined to the semiconductor die through the exposed end surface, and wherein the exposed end surface faces the semiconductor die.

15. The package of claim 8, further comprising:
a die attach supporting the semiconductor die, wherein the die attach is part of the single integral piece.

16. A semiconductor package comprising:
a semiconductor die;
an encapsulant material disposed around the semiconductor die; and
a lead extending outwards from the semiconductor package, the lead comprising a first section, disposed in the encapsulant material, extending in a first direction towards the semiconductor die;

a second section, disposed in the encapsulant material, extending away from the first section in a second direction, a third section, disposed in the encapsulant material, extending away from the second section in the first direction, and a fourth section, disposed in the encapsulant material, extending away from the third section, a fifth section, disposed in the encapsulant material, extending away from the third section, wherein the fourth section is parallel to the fifth section, wherein the first section, the second section, the third section, the fourth section, and the fifth section are a single integral piece without joints, wherein the fourth section and the fifth section are coupled to different contact regions of the semiconductor die.

17. The package of claim 16, further comprising:
a die attach supporting the semiconductor die.

18. The package of claim 17, wherein the die attach is part of the single integral piece.

19. The package of claim 16, wherein outer surfaces of the first section comprises a honeycomb pattern.

20. The package of claim 16, wherein the second section, the third section, the fourth section, and the fifth section form a U-shaped electrical connection.

21. A semiconductor package comprising:
a semiconductor die comprising a contact pad;
an encapsulant material disposed around the semiconductor die; and
a first lead extending outwards from the semiconductor package, the first lead comprising
　a first section, disposed in the encapsulant material, extending in a first direction towards the semiconductor die;
　a second section, disposed in the encapsulant material, extending away from the first section in a second direction, the second direction being perpendicular to the first direction, and
　a third section, disposed in the encapsulant material, extending away from the second section;
a second lead extending outwards from the semiconductor package, the second lead comprising
　a fourth section, disposed in the encapsulant material, extending in the first direction towards the semiconductor die;
　a fifth section, disposed in the encapsulant material, extending away from the fourth section in the second direction, and
　a sixth section, disposed in the encapsulant material, extending away from the fifth section; and
a common section, disposed in the encapsulant material, extending away from the third section and the sixth section, the common section joined with both the third section and the fifth section, the common section being attached to the contact pad on the semiconductor die, wherein the first section, the second section, the third section, the fourth section, the fifth section, the sixth section, and the common section are a single integral piece without joints.

22. The package of claim 21, wherein the second section or the third section has a first sidewall parallel to the second direction, and an opposite second sidewall inclined to the first sidewall.

23. The package of claim 21, wherein the second section or the third section comprises a varying cross-sectional area.

24. The package of claim 21, wherein the third section and the sixth are inclined and join together at the common section.

25. The package of claim 21, wherein the second section, the third section, the fourth section, the fifth section, the sixth section, and the common section form a U-shaped electrical connection.

* * * * *